US007975162B2

United States Patent
Kim et al.

(10) Patent No.: US 7,975,162 B2
(45) Date of Patent: Jul. 5, 2011

(54) APPARATUS FOR ALIGNING INPUT DATA IN SEMICONDUCTOR MEMORY DEVICE

(75) Inventors: Kyoung-Ho Kim, Hwaseong-Si (KR); Kwang-Il Park, Yongin-Si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 827 days.

(21) Appl. No.: 11/986,917

(22) Filed: Nov. 27, 2007

(65) Prior Publication Data

US 2008/0126822 A1 May 29, 2008

(30) Foreign Application Priority Data

Nov. 28, 2006 (KR) .................. 10-2006-0118017
Mar. 13, 2007 (KR) .................. 10-2007-0024269

(51) Int. Cl.
G06F 1/00 (2006.01)
G11C 7/00 (2006.01)
G11C 8/00 (2006.01)
(52) U.S. Cl. .............. 713/500; 365/219; 365/233.1
(58) Field of Classification Search .............. 713/500
See application file for complete search history.

(56) References Cited

U.S. PATENT DOCUMENTS 6,178,139 B1 * 1/2001 Hirobe et al. ............ 365/233.19
6,317,372 B1 * 11/2001 Hayashi et al. .............. 365/201
6,728,162 B2 * 4/2004 Lee et al. .................. 365/233.1
6,819,616 B2    11/2004 La et al. .................... 365/219
7,016,237 B2 * 3/2006 Lee et al. ................ 365/189.05
7,042,799 B2    5/2006 Cho ............................. 365/233
7,200,069 B2 * 4/2007 Jang et al. ................. 365/233.1
7,605,726 B2 * 10/2009 Byeon ......................... 341/100
2005/0138277 A1 6/2005 Koo

FOREIGN PATENT DOCUMENTS

JP          05091146 A  * 4/1993

OTHER PUBLICATIONS

Korean Patent Application No. 1020020016164 to Na et al., having Publication date of Oct. 1, 2003 (w/ English Abstract page).
Korean Patent Application No. 1020030093226 to Koo, having Publication date of Jun. 22, 2005 (w/ English Abstract page).
Korean Patent Application No. 1020030100162 to Cho, having Publication date of Jul. 7, 2005 (w/ English Abstract page).
Japanese Patent Application No. 2003-061751 to La et al., having Publication date of Oct. 31, 2003 (w/ English Abstract page).

* cited by examiner

*Primary Examiner* — Suresh K Suryawanshi
(74) *Attorney, Agent, or Firm* — Monica H. Choi (57) ABSTRACT

An apparatus for aligning input data in a semiconductor device includes at least one alignment block and a decision block. The at least one alignment block is for aligning serial input data into groups of parallel data synchronized to at least one divided data strobe signal for increasing margin between the maximum and minimum tDQSS values. The decision block is for selecting one of the groups of parallel data as valid data in response to synchronization information generated for removing any invalid data in the serial input data resulting from a write gap.

19 Claims, 12 Drawing Sheets

APPARATUS FOR ALIGNING INPUT DATA IN SEMICONDUCTOR MEMORY DEVICE

BACKGROUND OF THE INVENTION

This application claims priority under 35 USC §119 to Korean Patent Application Nos. 2006-118017, filed on Nov. 28, 2006 and 2007-24269, filed on Mar. 13, 2007 in the Korean Intellectual Property Office, the disclosures of which are incorporated herein in their entirety by reference.

FIELD OF THE INVENTION

The present invention relates generally to semiconductor memory devices, and more particularly, to alignment of input data in a DDR (double data rate) synchronous semiconductor memory device.

BACKGROUND OF THE INVENTION

The number of multimedia systems is increasing with the gradual increase of CPU data processing speed. Accordingly, with higher integration of semiconductor memory devices, increasing a bandwidth of a synchronous memory device is desired for improving operating speed of the semiconductor memory device.

For example, a DDR (double data rate) synchronous memory device consecutively processes two data units for one clock period with synchronization to both the rising and falling edges of an external clock signal. Thus, the DDR synchronous memory device has double bandwidth from an SDR (single data rate) synchronous memory device for increased operating speed.

For accurate timing of input and output data in the DDR synchronous memory device according to specifications of data set-up time and hold time at a destination, a data strobe signal DQS is input with data. A DQS generated for a data write operation in the DDR synchronous memory device is referred to as a write data strobe signal WDQS.

The WDQS is at a logic low state "0" before a predetermined clock cycle such as at one clock cycle 1 tCK from when a write command is generated when the WDQS makes a low to high transition as data is input. The WDQS is clocked with respect to the clock signal as data is input and transitions to the logic high state after the data is all input. The "tCK" indicates one clock cycle of the external clock signal CLK.

Such data is input with tuning of a set-up time and a hold time with respect to the single external WDQS and is stored in the DDR synchronous memory device. A time period from the rising edge of the clock signal CLK at which an external write command is input to a first rising edge of the WDQS when a first data is input, is referred to tDQSS. The range between maximum and minimum values of the tDQSS (such as a range of 1 tCK for example) is set for ensuring a stable write operation in the DDR synchronous memory device and so that the WDQS is activated at an accurate time.

Figure 1:
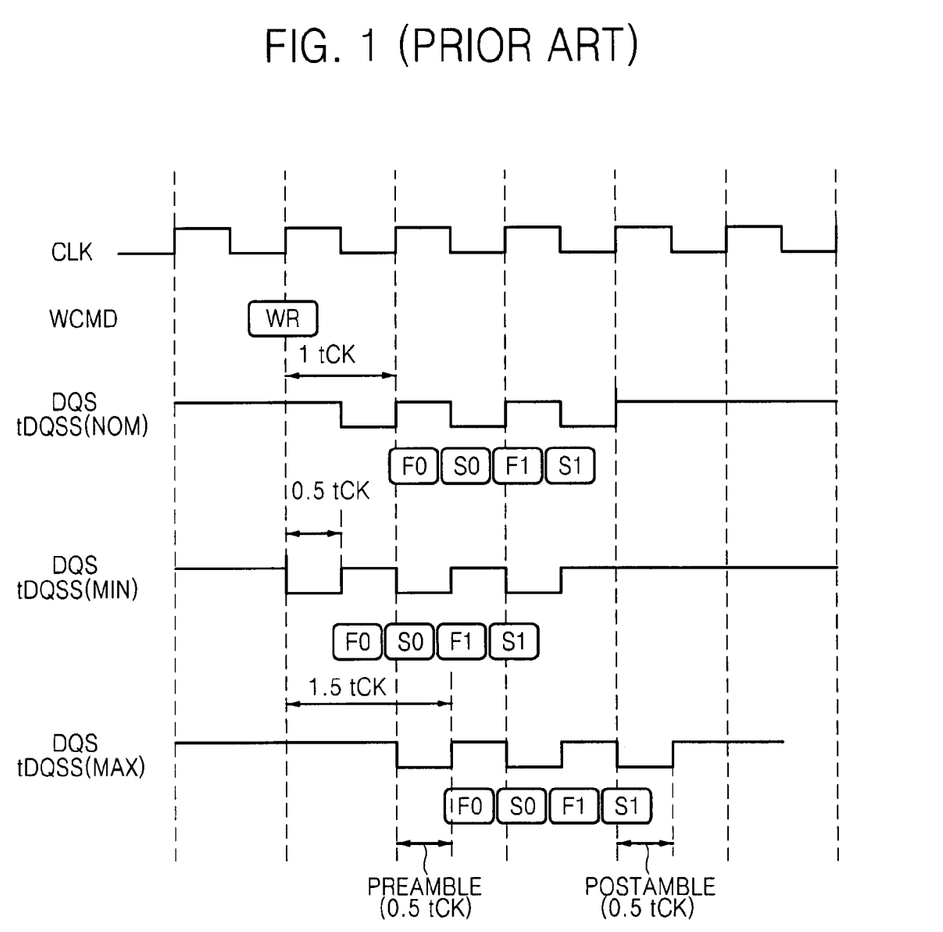
FIG. 1 is a timing diagram for illustrating maximum and minimum values of tDQSS in a DDR synchronous memory device according to the prior art.

FIG. 1 is a timing diagram showing the minimum value tDQSS(MIN) and the maximum value tDQSS(MAX) of the tDQSS in the DDR synchronous memory device. Referring to FIG. 1, when the I/O is for a POD (pseudo open drain), a DQS before preamble and a DQS after postamble is maintained in a logic low state with each being for a half clock cycle (0.5 tCK). In FIG. 1, the tDQSS(MIN) is 0.5 tCK, and the tDQSS (MAX) is 1.5 tCK such that a tDQSS margin is 1 tCK.

Figure 2:
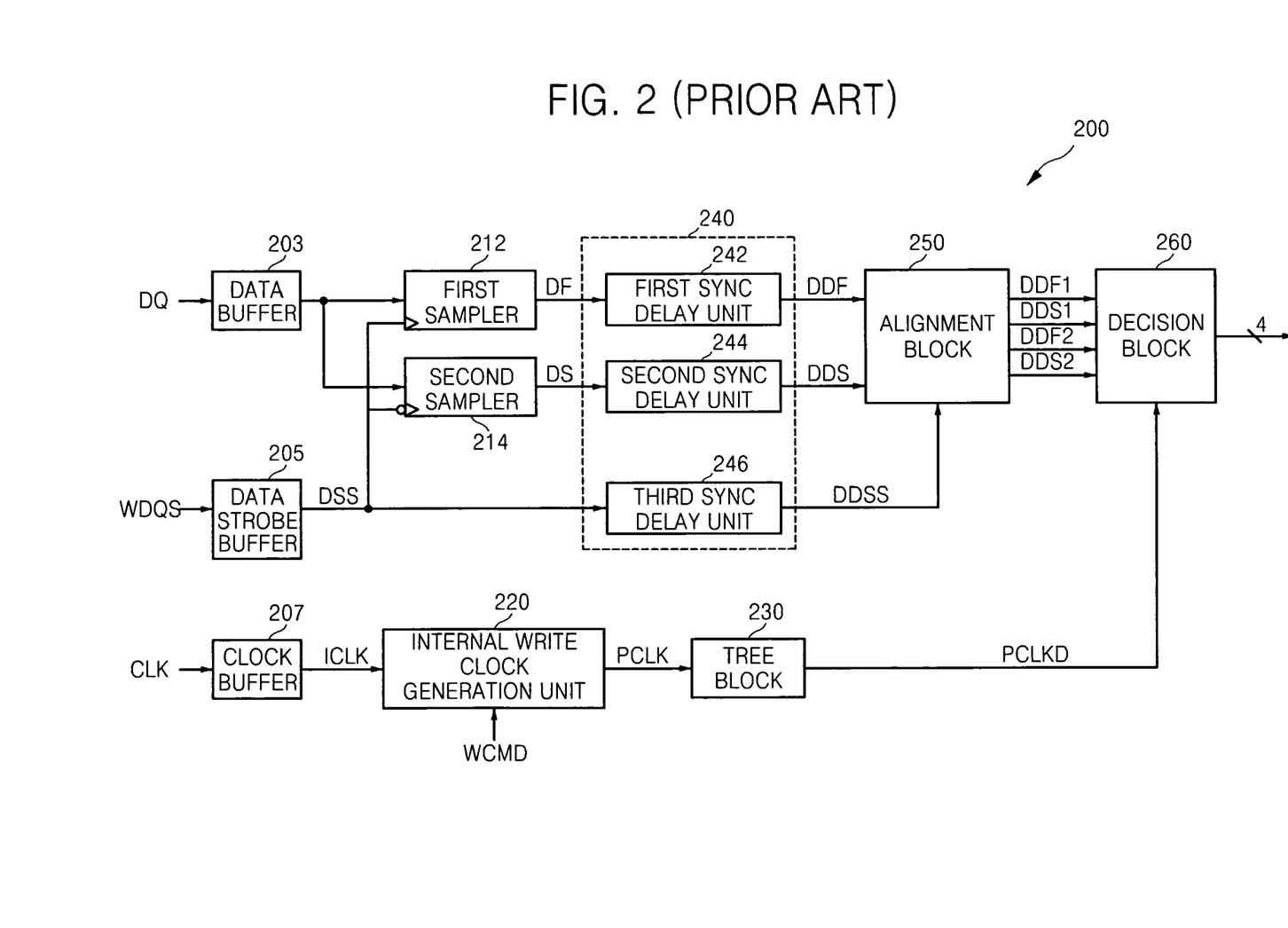
FIG. 2 is a block diagram of an input data alignment circuit with 4 bits pre-fetch in a conventional DDR synchronous memory device.
Figure 3:
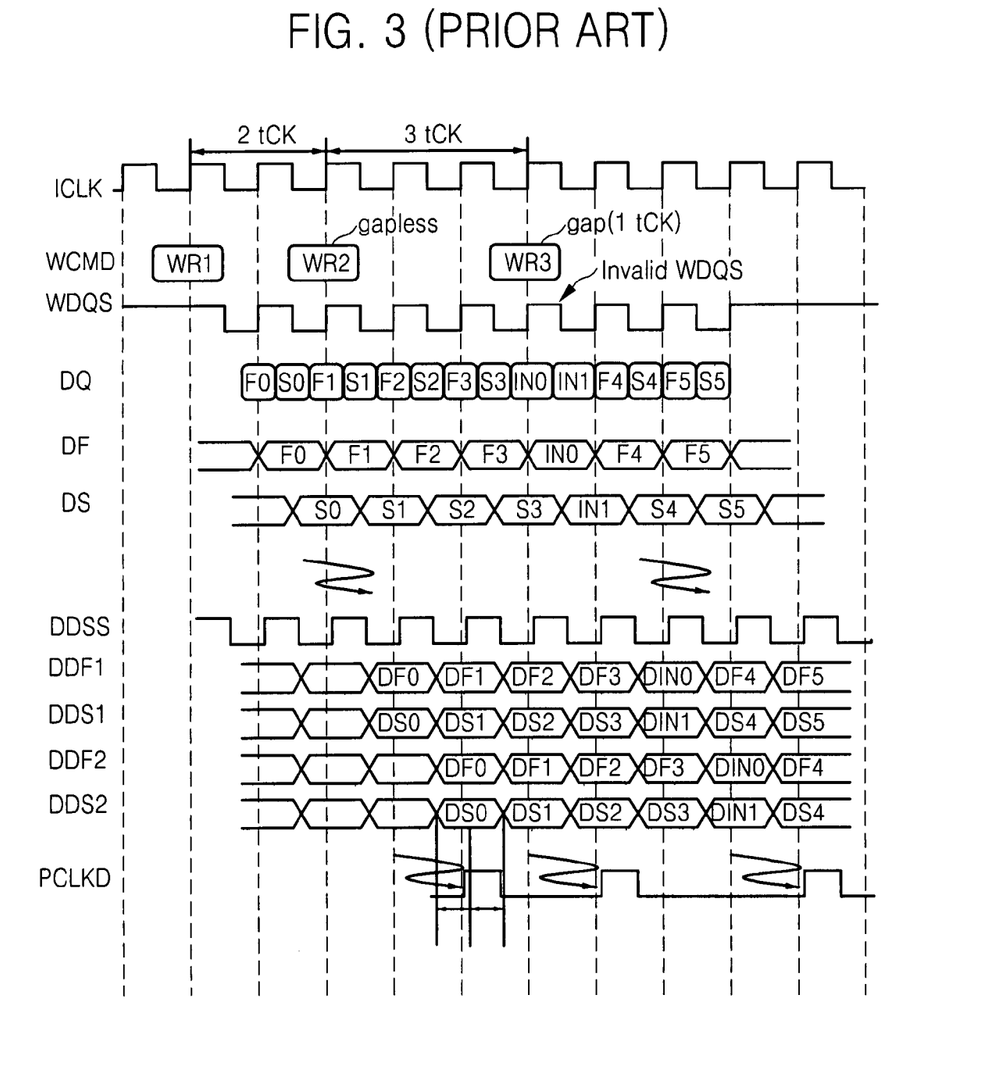
FIG. 3 is a timing diagram of signals during operation of the input data alignment circuit of FIG. 2, according to the prior art.

FIG. 2 shows a block diagram of an input data alignment circuit 200 supporting 4 bits pre-fetch in a conventional DDR synchronous memory device. FIG. 3 is a timing diagram of signals during operation of the data alignment circuit 200 of FIG. 2. Referring to FIGS. 2 and 3, the input data alignment circuit 200 includes a data buffer 203, a data strobe buffer 205, a clock buffer 207, a first sampler 212, a second sampler 214, an internal write clock generation unit 220, a tree block 230, an internal clock sync delay block 240, an alignment block 250, and a decision block 260.

The data buffer 203 buffers data DQ input from a source external to the DDR synchronous memory device. The data strobe buffer 205 buffers the WDQS also input from the external source to generate an internal data strobe signal DSS. The clock buffer 207 buffers a clock signal CLK input from the external source to generate a buffered internal clock signal ICLK.

The first sampler 212 samples the data DQ from the data buffer 203 in response to a first edge, such as rising edges for example, of the DSS. The second sampler 214 samples the DQ from the data buffer 203 in response to a second edge, such as falling edges for example, of the DSS. Each of a first data DF and a second data DS sampled by the first sampler 212 and the second sampler 214, respectively, have a data window of 1 tCK as shown in FIG. 3.

The internal write clock generation unit 220 generates an internal write clock signal PCLK from ICLK and a write command signal WCMD from the external source. PCLK is supplied to the decision block 260 through the tree block 230. The tree block 230 is comprised of a series of plurality of inverters (not shown) for delaying PCLK for a predetermined first delay time to generate a delayed internal write clock signal PCLKD.

The internal clock sync delay block 240 includes a first sync delay unit 242, a second sync delay unit 244, and a third sync delay unit 246. The first sync delay unit 242 delays the first data DF for the predetermined first delay time to generate a delayed first data DDF. The second sync delay unit 244 delays the second data DS for the predetermined first delay time to generate a delayed second data DDS. Also, the third sync delay unit 246 delays the DSS for the predetermined first delay time to generate a delayed internal data strobe signal DDSS. In this manner, the internal clock sync delay unit 240 synchronizes the DDF, the DDS, and the DDSS with PCLKD.

The alignment block 250 aligns each data of the DDF and DDS into 4 bits parallel data DDF1, DDS1, DDF2, and DDS2 as shown in FIG. 3 synchronized to DDSS such as synchronized to falling edges of DDSS in a DQS domain state. The decision block 260 selects from groups of parallel data DDF1, DDS1, DDF2, and DDS2 in synchronism to PCLKD to generate valid data. Thus, the decision block 260 changes the DQS domain state of DDF1, DDS1, DDF2, and DDS2 to a domain state of the PCLKD.

The decision block 260 decides the minimum/maximum values of the tDQSS, that is, a tDQSS margin, with respect to each bit data of the DDF1, DDS1, DDF2, and DDS2 based on the PCLKD. Accordingly, during a write operation with a burst length (BL) of 4, the conventional data alignment circuit 200 with 4 bits pre-fetch generates at least 4 tDQSS maximum/minimum value decision points with respect to each DDF1, DDS1, DDF2, and DDS2 for each DQ pin. For example, at least a total of 128 tDQSS maximum/minimum value decision points are generated with respect to a graphic semiconductor memory device having 32 DQ pins during a write operation with a burst length of 4.

The maximum and minimum values of the tDQSS define the margin between PCLKD and each of DDF1, DDS1, DDF2, and DDS2 in the PCLK domain state. In general, the maximum and minimum values of the tDQSS are each a predetermined value such as 0.5 tCK from a center point of a PCLKD window. In FIG. 3, since PCLKD has a window of 1 tCK, the tDQSS maximum/minimum values for each bit data of DDF1, DDS1, DDF2, and DDS2 is ideally 0.5 tCK such that the tDQSS margin is 1 tCK.

However, the tDQSS margin may not actually be 1 tCK due to skew between data lines, power noise, and a plurality of tDQSS maximum/minimum value decision points. As the clock frequency increases, the preset tDQSS maximum/minimum values may become insufficient resulting in restriction to the write operation. Accordingly, a wider tDQSS margin is desired with increased tDQSS maximum/minimum values.

A predetermined write delay time tCCD (column address strobe command delay) exists between write commands (such as WR1, WR2, and WR3 in FIG. 3) to the semiconductor memory device. For example in FIG. 3, when tCCD=2 tCK, a third write command WR3 has a write gap. An invalid write strobe signal (invalid WDQS) may be generated from the WR3 command with the write gap as shown in FIG. 3. Such an invalid WDQS may result in invalid data such as DIN0 or DIN1 being sampled into the memory device. A mechanism for eliminating such invalid data is desired.

SUMMARY OF THE INVENTION

Accordingly, an apparatus for aligning input data in a semiconductor memory device according to the present invention increases the tDQSS margin and eliminates invalid data resulting from a write gap.

According to an aspect of the present invention, an apparatus for aligning input data in a semiconductor device includes at least one alignment block and a decision block. The at least one alignment block is for aligning serial input data into groups of parallel data synchronized to at least one divided data strobe signal. The decision block is for selecting one of the groups of parallel data as valid data in response to synchronization information generated for removing any invalid data in the serial input data resulting from a write gap.

In an embodiment of the present invention, the apparatus further includes first and second alignment blocks. The first alignment block is for aligning the serial input data into first parallel data synchronized to a first data strobe signal, with each of the at least one divided data strobe signal having a frequency that is 1/N times a frequency of the first data strobe signal. The second alignment block is for further aligning the first parallel data, synchronized to the at least one divided data strobe signal to generate the groups of the parallel data.

In another embodiment of the present invention, a first data window for the first parallel data is a cycle of the first data strobe signal, and a second data window for the groups of parallel data is a cycle of the at least one divided data strobe signal.

In a further embodiment of the present invention, the apparatus includes a data strobe buffer and a frequency divider. The data strobe buffer is for generating the first data strobe signal from an external write data strobe signal. The frequency divider is for generating a first divided data strobe signal and a second divided data strobe signal that is 180° phase-shifted from the first divided data strobe signal.

In another embodiment of the present invention, the second alignment block includes first and second alignment units. The first alignment unit is for generating a first group of parallel data synchronized to the first divided data strobe signal. The second alignment unit is for generating a second group of parallel data synchronized to the second divided data strobe signal.

The first alignment block generates X-parallel data that are X-consecutive data of the serial input data. In that case, each of the first and second groups of parallel data include respective X-parallel data that are X-consecutive data of the serial input data. For example, X=4 in an example embodiment of the present invention.

In a further embodiment of the present invention, the apparatus also includes a sync information detection unit for generating the synchronization information from the first and second divided data strobe signal, an external clock signal used for synchronizing the serial input data, and write commands associated with the external write data strobe signal.

In another embodiment of the present invention, the apparatus further includes a clock buffer, a write clock generation unit, and a tree block. The clock buffer is for generating an internal clock signal (ICLK) from the external clock signal. The write clock generation unit is for generating an internal write clock signal (PCLK) from the internal clock signal and the write commands. The tree block is for generating a delayed internal write clock signal (PCLKD) from the internal write clock signal. The synchronization information is generated by being clocked to the delayed internal write clock signal (PCLKD).

In a further embodiment of the present invention, the apparatus also includes a sync delay unit and first and second flip-flops. The sync delay unit is for generating a first delayed divided data strobe signal (DDSS_E) and a second delayed divided data strobe signal (DDSS_O). The first flip-flop is for latching the first delayed divided data strobe signal (DDSS_E) clocked with the delayed internal write clock signal (PCLKD) to generate a first synchronization information (PCLKD_E). The second flip-flop is for latching the second delayed divided data strobe signal (DDSS_O) clocked with the delayed internal write clock signal (PCLKD) to generate a second synchronization information (PCLKD_O). The first and second synchronization information is used by the decision block for selecting one of the first and second groups of parallel data as the valid data.

In another embodiment of the present invention, the first and second synchronization information are set to predetermined logic levels such that the decision block selects a predetermined one of the first and second groups of parallel data when no invalid data is generated within the serial input data with no invalid external write data strobe signal being generated during the write gap.

In a further embodiment of the present invention, a margin between minimum and maximum tDQSS values is two times a cycle of the external clock signal.

In another embodiment of the present invention, the apparatus includes a selection block for generating selection signals used by the decision block for selecting one of the groups of parallel data, from an external clock signal used for synchronizing the serial input data and write commands associated with the external write data strobe signal.

In that case, the apparatus includes a gap information signal detection block for determining a respective write gap between each set of two consecutive write commands. The selection block transmits a pulse of the delayed internal write clock signal (PCLKD) to a first selection signal (S_E) if a write gap is not present and to a second selection signal (S_O) if a write gap is present. The decision block selects the first group of parallel data when the pulse of the delayed internal write clock signal (PCLKD) is transmitted to the first selection signal (S_E), and selects the second group of parallel data when the pulse of the delayed internal write clock signal (PCLKD) is transmitted to the second selection signal (S_O).

In a further embodiment of the present invention, the valid data as generated by the decision block preserves an order of the serial input data.

In another embodiment of the present invention, the invalid data is generated in response to an invalid external write data strobe signal generated during the write gap. The write gap occurs when a time period between two consecutive write commands is more than a predetermined write command delay time.

In an alternative embodiment of the present invention, no invalid data is generated within the serial input data when no invalid external write data strobe signal is generated during the write gap.

The present invention may be used to particular advantage when the semiconductor device is a DDR (double data rate) semiconductor memory device. In that case, the apparatus for aligning input data widens the tDQSS margin and eliminates any invalid data resulting from a write gap.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and/or function.

DETAILED DESCRIPTION OF THE INVENTION

Figure 4:
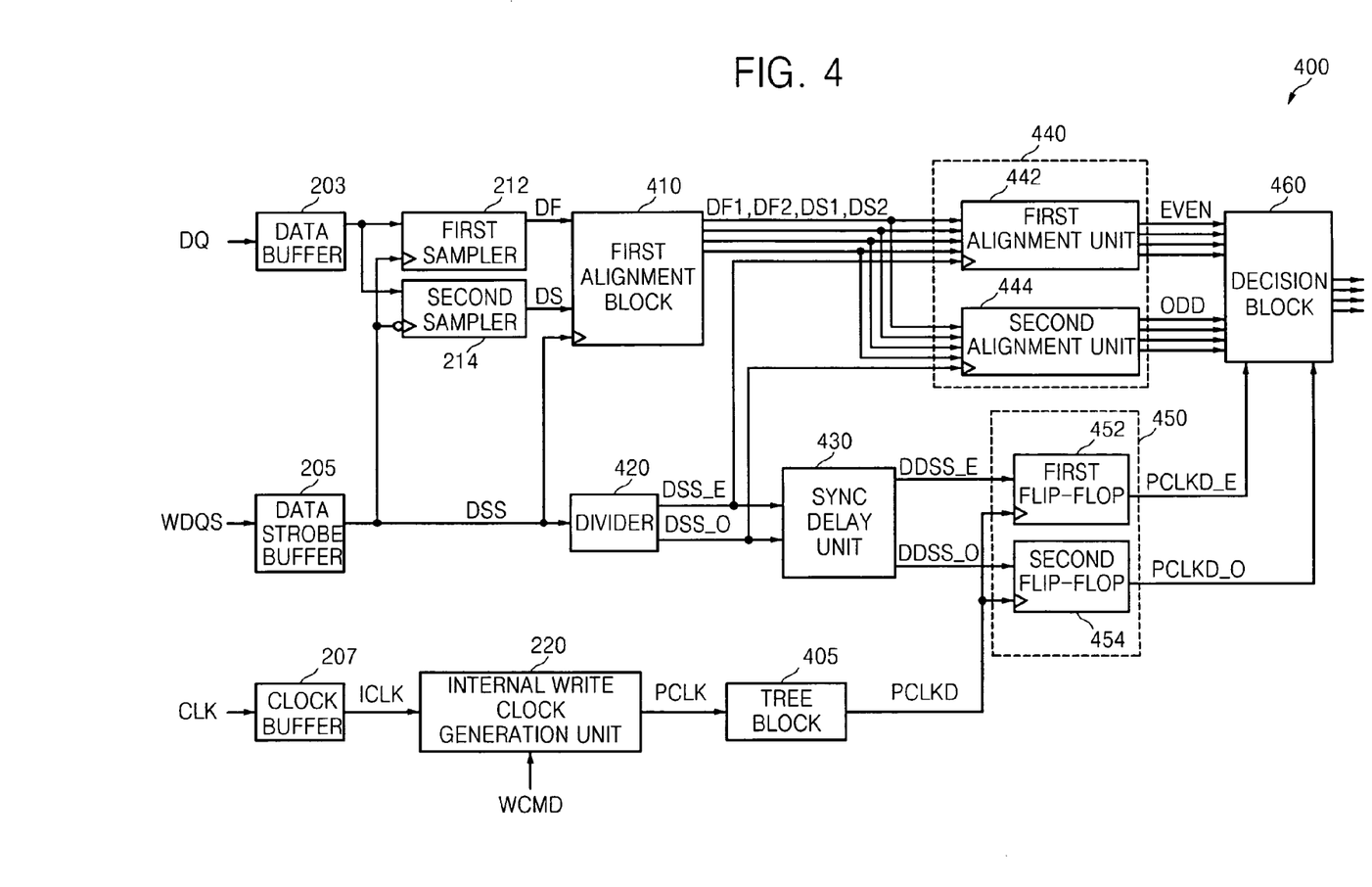
FIG. 4 is a block diagram of an apparatus for input data alignment with 4 bits pre-fetch in a DDR synchronous semiconductor memory device according to an embodiment of the present invention.

FIG. 4 is a block diagram of an apparatus 400 for input data alignment with 4-bits pre-fetch in a DDR (double data rate) synchronous semiconductor memory device according to an embodiment of the present invention. The apparatus 400 for input data alignment may be fabricated as part of the synchronous DDR (double data rate) semiconductor memory device such as a DDR SDRAM (synchronous DRAM) inputting a write data strobe signal WDQS.

Figure 5:
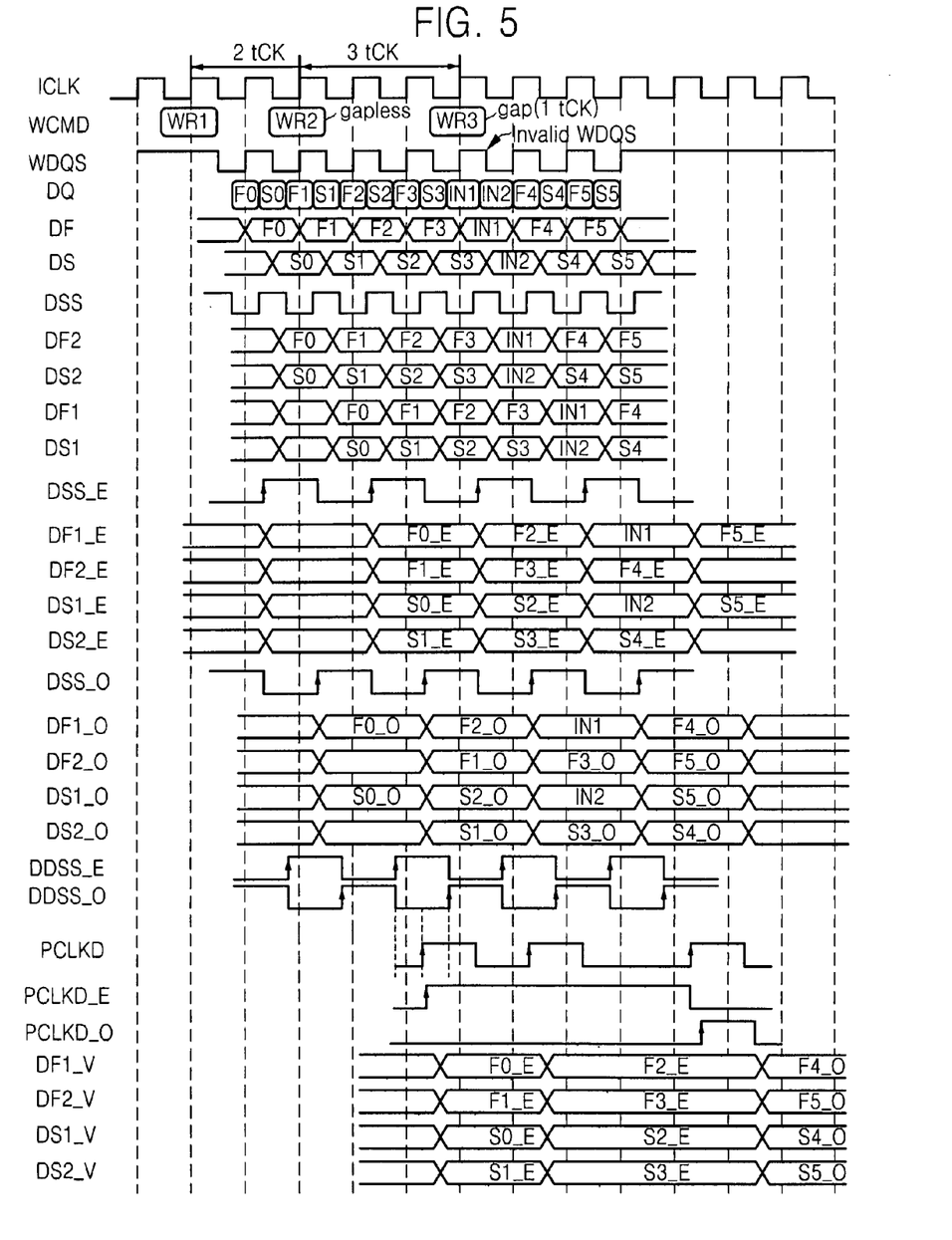
FIG. 5 is a timing diagram of signals during operation of the apparatus for input data alignment in FIG. 4, according to an embodiment of the present invention.

FIG. 5 shows a timing diagram of signals during operation of the apparatus 400 of FIG. 4 according to an embodiment of the present invention. Referring to FIG. 5, an invalid write strobe signal (Invalid WDQS) is generated with a third write command WR3 having a write gap in an I/O environment using a POD (pseudo open drain) type interface, according to an example embodiment of the present invention.

A write command signal WCMD includes a series of write commands including first, second, and third write commands WR1, WR2, and WR3, respectively, in FIG. 5 for example. A predetermined write command delay time tCCD (column address strobe command delay) is determined according to a data burst length of a write operation. For example, when the data burst length is 4 as illustrated in FIG. 5, the predetermined write command delay time tCCD is 2 tCK with tCK being one clock cycle of ICLK. The second write command WR2 that is input 2 tCK after the first write command WR1 does not have a write gap.

In contrast, the third write command WR3 is input 3 tCK after the second write command WR2 with a write gap of 1 tCK. A write gap occurs when two consecutive write commands are generated with more delay time from each-other than the predetermined write command delay time tCCD.

Referring to FIGS. 4 and 5, with burst length of 4, serial input data DQ is input at rising and falling edges of WDQS according to the write commands WR1, WR2, and WR3. During the write gap of the third write command WR3, an invalid write strobe signal (Invalid WDQD) is generated such that invalid data IN1 and IN2 are sampled as the serial input data DQ.

Referring to FIG. 4, the apparatus 400 includes the data buffer 203, the data strobe buffer 205, the clock buffer 207, the first sampler 212, the second sampler 214, and the internal write clock generation unit 220, that are similar to components having the same reference number in FIG. 2. The apparatus 400 of FIG. 4 further includes a tree block 405, a first alignment block 410, a divider 420, a sync delay unit 430, a second alignment block 440, a sync information detection unit 450, and a decision block 460.

Since the data buffer 203, the data strobe buffer 205, the clock buffer 207, the first sampler 212, the second sampler 214, and the internal clock generation unit 220 have similar function/structure as the components having the same reference number in FIG. 2, description thereof is omitted here. Each of the first sampler 212 and the second sampler 214 may be embodied with a respective set of at least one flip-flop.

The internal write clock signal PCLK is generated by the internal write clock generation unit 220 from the write command signal WCMD and the internal clock signal ICLK from the clock buffer 207 similar as described in reference to FIG. 2. The internal write clock signal PCLK is supplied to the sync information detection unit 450 via the tree block 405. The tree block 405 includes a plurality of inverters such as in an inverter chain (not shown) for generating a delayed internal write clock signal PCLKD having a predetermined delay time from the internal write clock signal PCLK. The delayed internal write clock signal PCLKD is supplied to the sync information detection unit 450.

In an example embodiment of the present invention, the number of inverters in the inverter chain of the tree block 405 of FIG. 4 is less than that of the tree block 230 of FIG. 2.

Accordingly, the time delay provided by the tree block 405 in FIG. 4 is shorter than the time delay provided by the tree block 230 of FIG. 2. With such simpler circuitry of the tree block 405 of FIG. 4, the delay variation of the internal strobe signal DSS with respect to the delayed internal write clock signal PCLKD may be reduced such that the tDQSS margin may be increased. In addition, the simpler circuitry of the tree block 405 has reduced layout burden and power consumption.

The first alignment block 410 of FIG. 4 has similar structure and/or function as the alignment block 250 of FIG. 2 but has different input and output signals. The first alignment block 410 may include at least one flip-flop (not shown) that is clocked with a first data strobe signal (i.e., the internal data strobe signal) DSS from the data strobe buffer 205. The first alignment block 410 of FIG. 4 aligns data DF sampled by the first sampler 212 and data DS sampled by the second sampler 214 into first parallel data DF1, DF2, DS1, and DS2 according to a first edge such as rising edges of DSS, as illustrated in the timing diagram of FIG. 5.

The divider 420 is a frequency divider that generates a first divided data strobe signal DSS_E by dividing a frequency of the first data strobe signal DSS by a natural number N, such as N=2 for example. The frequency divider 420 also generates a second divided data strobe signal DSS_O having a phase difference of 180° from the first divided data strobe signal DSS_E that has the same phase as DSS.

The sync delay unit 430 delays each of the divided data strobe signals DSS_E and DSS_O for a predetermined delay time such as the delay time through the tree block 405, to synchronize the divided data strobe signals DSS_E and DSS_O with the delayed internal write clock signal PCLKD to generate first and second delayed divided data strobe signals DDSS_E and DDSS_O, respectively.

The second alignment block 440 includes a first alignment unit 442 and a second alignment unit 444. The first alignment unit 442 further aligns the first parallel data DF1, DF2, DS1, and DS2 to be synchronized to the first delayed divided data strobe signal DSS_E to generate a first group of even-numbered parallel data DF1_E, DF2_E, DS1_E, and DS2_E (hereinafter, referred to as the "EVEN") as illustrated in FIG. 5. The second alignment unit 444 further aligns the first parallel data DF1, DF2, DS1, and DS2 to be synchronized to the second delayed divided data strobe signal DSS_O to generate a second group of odd-numbered parallel data DF1_O, DF2_O, DS1_O, and DS2_O (hereinafter, referred to as the "ODD") as illustrated in FIG. 5.

The sync information detection unit 450 generates sync information PCLKD_E and PCLKD_O from the first and second delayed divided data strobe signals DDSS_E and DDSS_O and the delayed internal write clock signal PCLKD. The sync information detection unit 450 includes a first flip-flop 452 and a second flip-flop 454. The first flip-flop 452 latches the first delayed divided data strobe signal DDSS_E with being clocked by PCLKD to generate a first sync information signal PCLKD_E as illustrated in FIG. 5 and latches the second delayed divided data strobe signal DDSS_O with being clocked by PCLKD to generate a second sync information signal PCLKD_O as illustrated in FIG. 5.

The decision block 460 selects one of the first and second groups of parallel data EVEN or ODD based on PCKD_E and PCLKD_O to generate valid data DF1_V, DF2_V, DS1_V, and DS2_V as illustrated in FIG. 5. For example, the DDSS_E is in a logic high state, and the DDSS_O is in a logic low state at the rising edge of the PCLKD. The group of parallel data synchronized to one of the DDSS_E and DDSS_O being in the logic high state at each rising edge of PCLKD is selected by the decision block 460 as the valid data DF1_V, DF2_V, DS1_V, and DS2_V, according to one embodiment of the present invention.

The valid data DF1_V, DF2_V, DS1_V, and DS2_V replicates data F0, F1, . . . and S0, S1, . . . . Including the order of the serial input data DQ but with the invalid data IN1 and IN2 being eliminated. The first and second groups of parallel data EVEN or ODD are synchronized with respect to DSS_E and DSS_O and thus are in a domain state of a data strobe signal (i.e., a DQS domain state). The decision block 460 generates the valid data DF1_V, DF2_V, DS1_V, and DS2_V in the DQS domain state according to PCLKD_E and PCLKD_O.

Further referring to FIG. 5, note that each data unit F0, F1, . . . , S0, S1, . . . as generated by the first and second samplers 212 and 214 and the first alignment block 410 has a data window of one cycle 1 tCK of the internal clock signal ICLK. In addition, each data unit F0_E, F1_E, . . . , F0_O, F2_O, . . . , S0_E, S1_E, . . . , S0_O, S2_O . . . of the first and second groups of parallel data as generated by the second alignment block 440 has a data window of two cycles 2 tCK of the internal clock signal ICLK. Accordingly, the margin between the maximum and minimum values of tDQSS is increased to two cycles 2 tCK of the internal clock signal ICLK in the present invention from the one cycle 1 tCK of the internal clock signal ICLK in the prior art.

The apparatus 400 for input data alignment of FIG. 4 is merely an example embodiment of the present invention that is not limited thereto. For example, the divider 420 may divide DSS into N divided data strobe signals having different phases with N being an integer higher than 2. In that case, the second alignment block 440 would include N-number of alignment units each further aligning DF1, DF2, DS1, and DS2 synchronized to a respective one of the N divided data strobe signals.

Further in that case, the sync delay unit 430 would delay each of the N divided data strobe signals for the predetermined delay time of the tree block 405. Also in that case, the sync information detection unit 450 would include N flip-flops each latching a corresponding one of the N divided data strobe signals clocked with PCLKD. Further in that case, the decision block 460 selects one of the groups of parallel data from the second alignment block 440 according to the sync information from the N flip-flops of the sync information detection unit 450.

Figure 6:
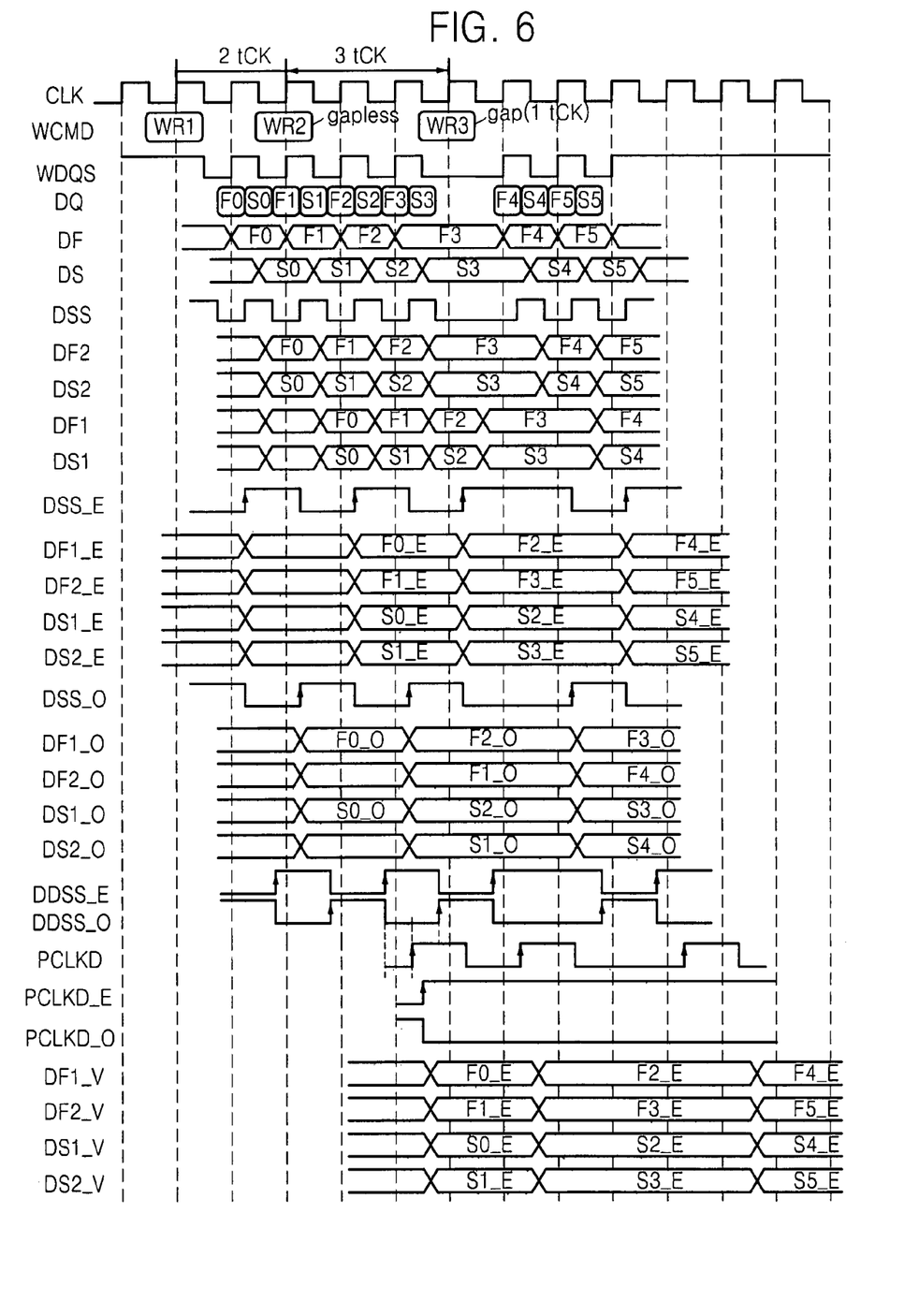
FIG. 6 is a timing diagram of signals during operation of the apparatus for input data alignment in FIG. 4, according to another embodiment of the present invention.

FIG. 6 is another timing diagram of signals during operation of the apparatus 400 for input data alignment of FIG. 4 when a Invalid WDQS is not generated during the write gap of the third write command WR3. In that case, the invalid data IN1 and IN2 of FIG. 5 is not sampled as the serial input data DQ in FIG. 6. In addition, since the Invalid WDQS is not generated, PCLKD_E maintains a logic high state at each rising edge of PCLKD while PCLK_O maintains a logic low state at each rising edge of PCLKD. Thus, the first group of parallel data EVEN (comprised of DF1_E, DF2_E, DS1_E, and DS2_E) is determined as the valid data DF1_V, DF2_V, DS1_V, and DS2_V in FIG. 6.

Figure 7:
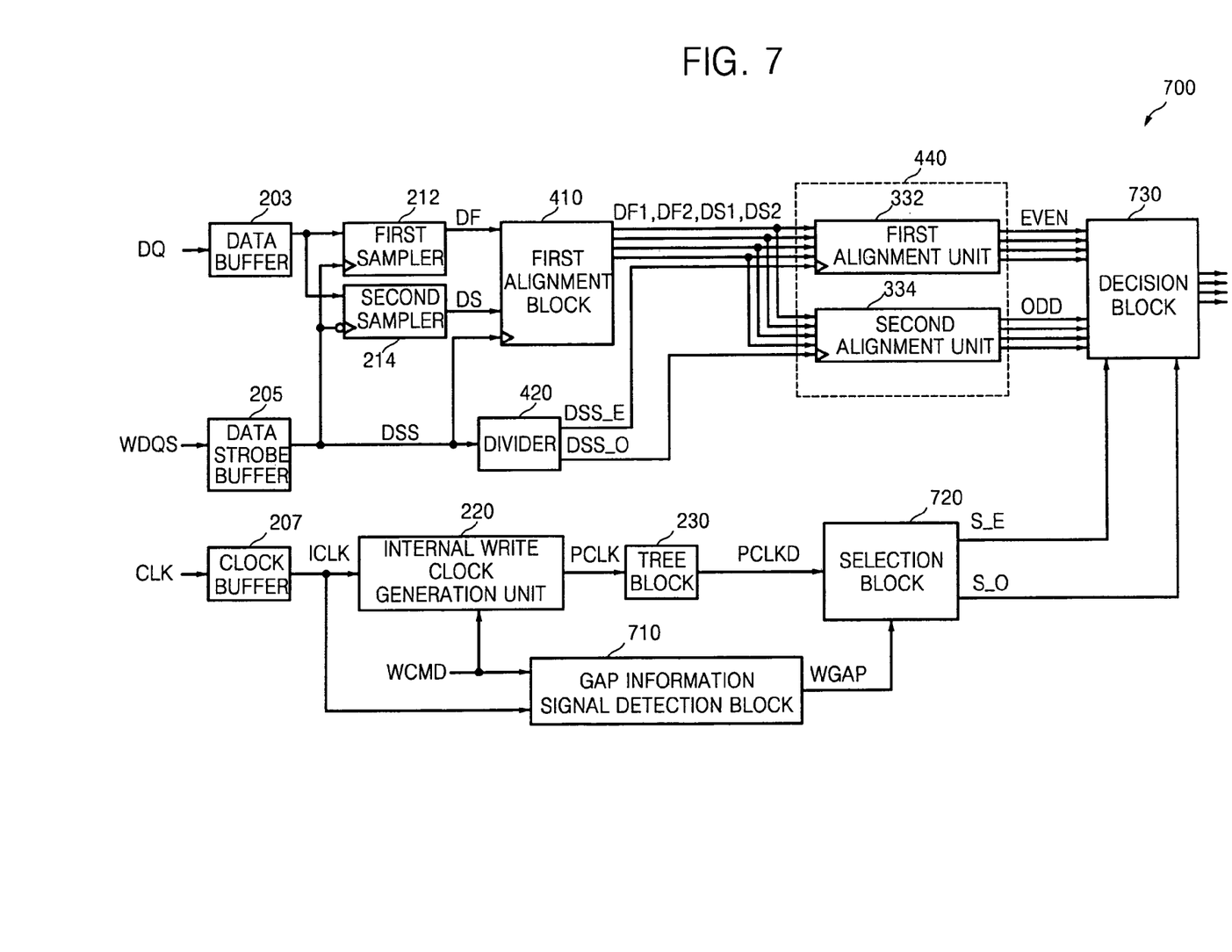
FIG. 7 is a block diagram of an apparatus for input data alignment with 4 bits pre-fetch in a DDR synchronous semiconductor memory device according to another embodiment of the present invention.

FIG. 7 is a block diagram of an apparatus 700 for input data alignment with 4 bits pre-fetch in a DDR (double data rate) synchronous semiconductor memory device according to another embodiment of the present invention. Referring to FIG. 7, the apparatus 700 includes the data buffer 203, the data strobe buffer 205, the clock buffer 207, the first sampler 212, the second sampler 214, the internal write clock generation unit 220, the tree block 230, the first alignment block 410, the divider 420, and the second alignment block 440.

Since the data buffer 203, the data strobe buffer 205, the clock buffer 207, the first sampler 212, the second sampler 214, the internal write clock generation unit 220, the tree block 230, the first alignment block 410, the divider 420, and the second alignment block 440 have similar function/structure as the components having the same reference number in FIGS. 2 and 4, description thereof is omitted here. The apparatus 700 of FIG. 7 further includes a gap information signal detection block 710, a selection block 720, and a decision block 730.

Figure 8:
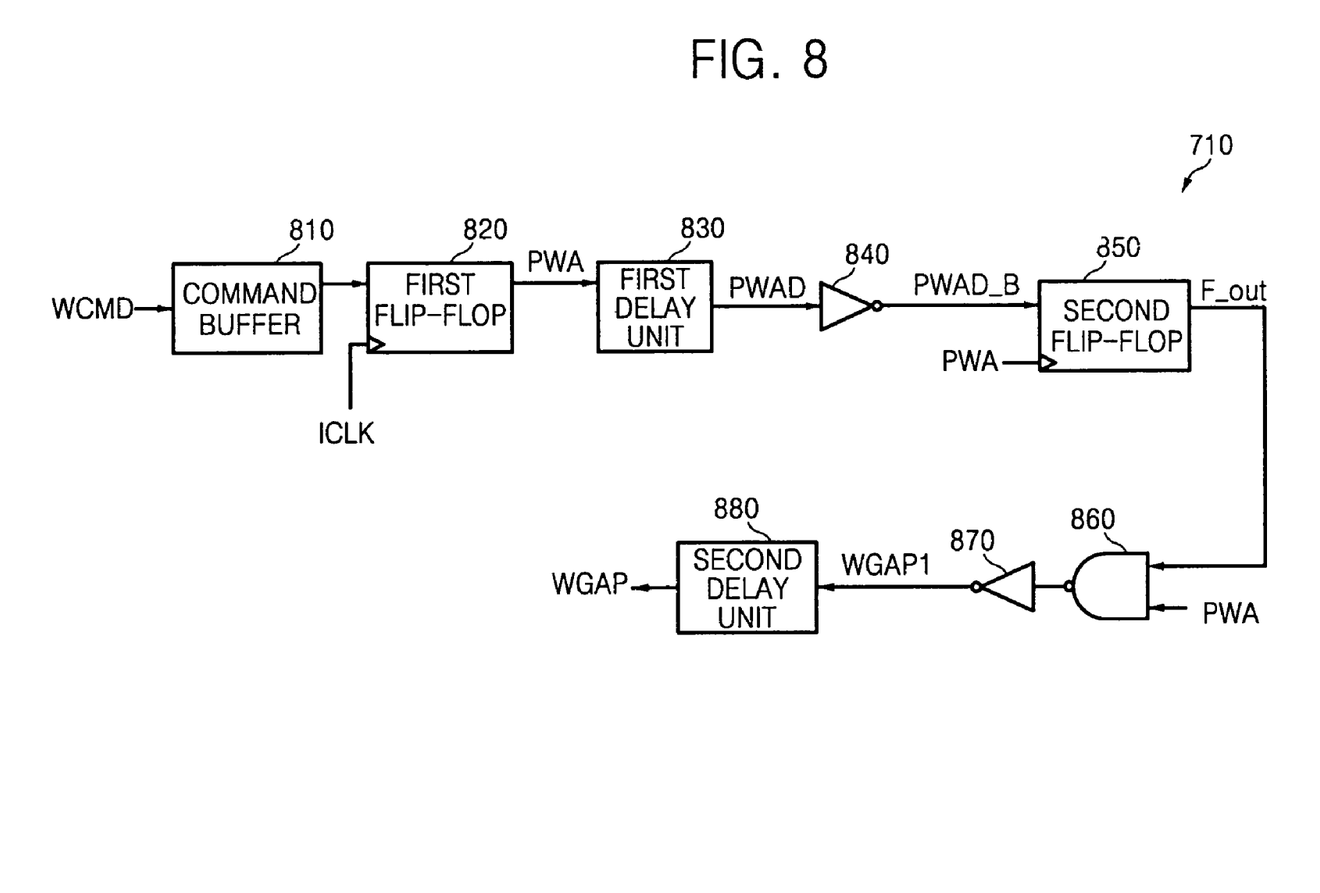
FIG. 8 is a circuit diagram of a gap information signal detection block of FIG. 7, according to an embodiment of the present invention.

The gap information signal detection block 710 generates a gap information signal WGAP from the write command signal WCMD having the write commands such as WR1, WR2, and WR3 for example and the internal clock signal ICLK. FIG. 8 is a circuit diagram of the gap information signal detection block 710 of FIG. 7, according to an example embodiment of the present invention. Referring to FIG. 8, the gap information signal detection block 710 includes a command buffer 810, a first flip-flop 820, a first delay unit 830, a first inverter 840, a second fillip-flop 850, a logic operator 860, a second inverter 870, and a second delay unit 880.

The command buffer 810 receives and buffers the command signal WCMD, and the first flip-flop 820 latches the buffered WCMD from the command buffer 810 clocked with the internal clock signal ICLK such as at rising edges of ICLK to generate a latched signal PWA. The first delay unit 830 delays the latched signal PWA for a predetermined delay time to generate a delayed latched signal PWAD. The first inverter 840 inverts the delayed latched signal PWAD from the first delay unit 830 to generate an inverted latched signal PWAD_B. For example, the predetermined delay time of the first delay unit 830 may be the predetermined write command delay time tCCD (=2 tCK) according to the data burst length of the write operation.

The second flip-flop 850 latches the inverted latched signal PWAD_B clocked with the latched signal PWA from the first flip-flop 820 such as at rising edges of the latched signal PWA to generate a further latched signal F_out. The logic operator 860 performs a logic operation (such as a NAND operation) on the further latched signal F_out and the latched signal PWA for generating an output that is inverted by the second inverter 870 to generate a first write gap signal WGAP1. Thus, only when both of F_out and PWA have a logic high state, the first write gap signal WGAP1 also has the logic high state.

The second delay unit 880 delays the first write gap signal WGAP1 by a second predetermined delay time to generate a delayed write gap signal WGAP. For example, such second predetermined delay time may be a predetermined write delay time (write latency) tWL according to the specifications of the DDR semiconductor memory device having the apparatus 700 fabricated therein.

The first write gap signal WGAP1 is at a logic high state if the write command signal WCMD has a write gap. In the example of the timing diagram of FIG. 10, the first write gap signal WGAP1 is at the logic high state shortly after the third write command WR3 having the write gap and is at the logic low state shortly after the second write command WR2 having no write gap.

Figure 9:
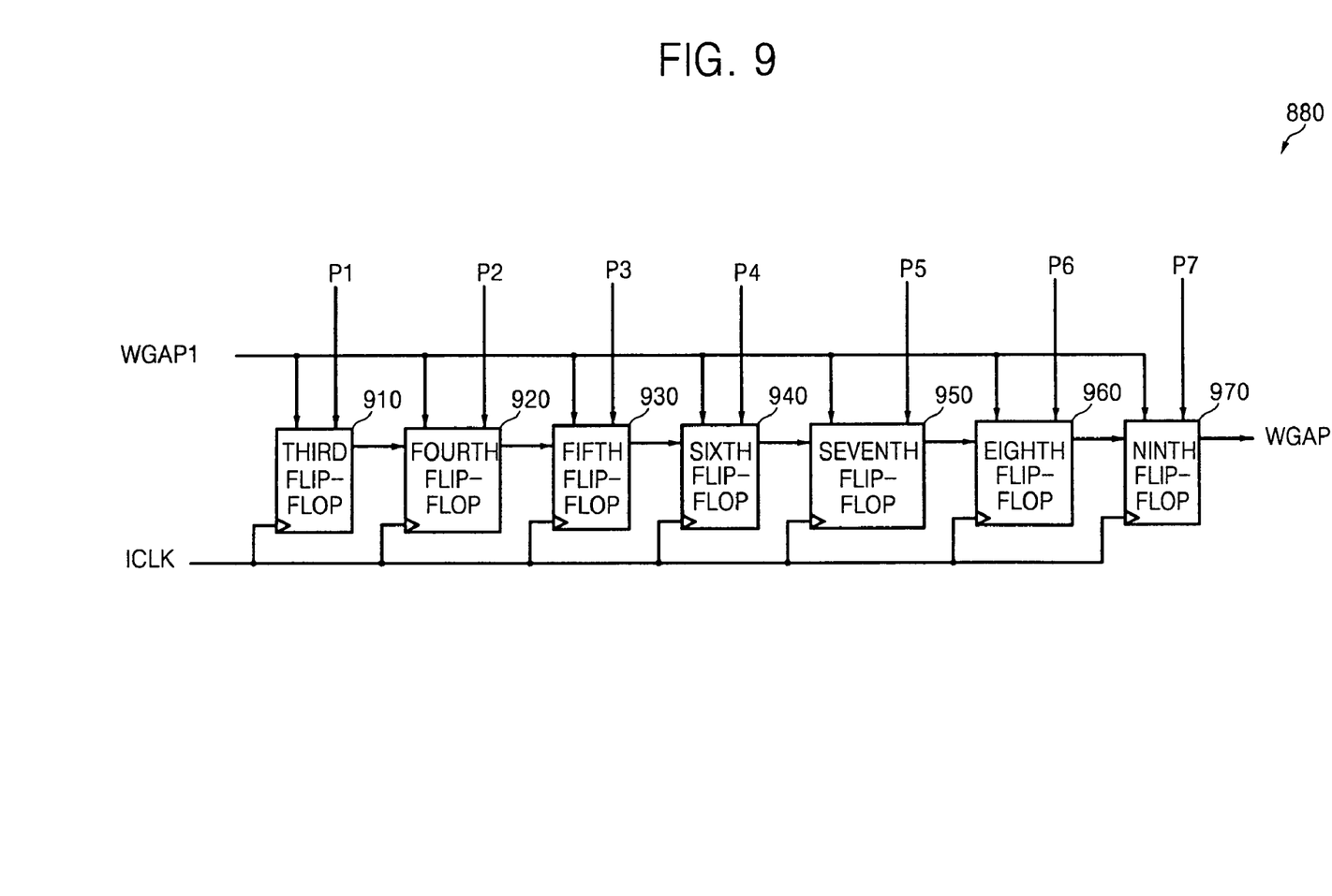
FIG. 9 is a circuit diagram of a second delay unit in FIG. 4, according to an embodiment of the present invention.

FIG. 9 is a circuit diagram of the second delay unit 880 of FIG. 8, according to an example embodiment of the present invention. Referring to FIG. 9, the second delay unit 880 includes a plurality of flip-flops (F/F) 910, 920, 930, 940, 950, 960, and 970 configured in series as a shift register. Each of the flip-flops 910, 920, 930, 940, 950, 960, and 970 is clocked by the internal clock signal ICLK.

Each of the flip-flops 910, 920, 930, 940, 950, 960, and 970 receives a respective one of a plurality of control signals P1, P2, P3, P4, P5, P6, and P7 as illustrated in FIG. 9. One of the flip-flops 910, 920, 930, 940, 950, 960, and 970 receiving the respective one of the control signals P1, P2, P3, P4, P5, P6, and P7 set to the logic high state latches in the WGAP1 signal from the second inverter 870. For example, if the fourth control signal P4 is at the logic high state while the rest of the control signals P1, P2, P3, P5, P6, and P7 are at the logic low state, the WGAP1 signal is latched by just the sixth flip-flop 940. Thus, the WGAP signal from the ninth flip-flop 970 is generated with 3 tCK delay from the WGAP1 signal.

Figure 10:
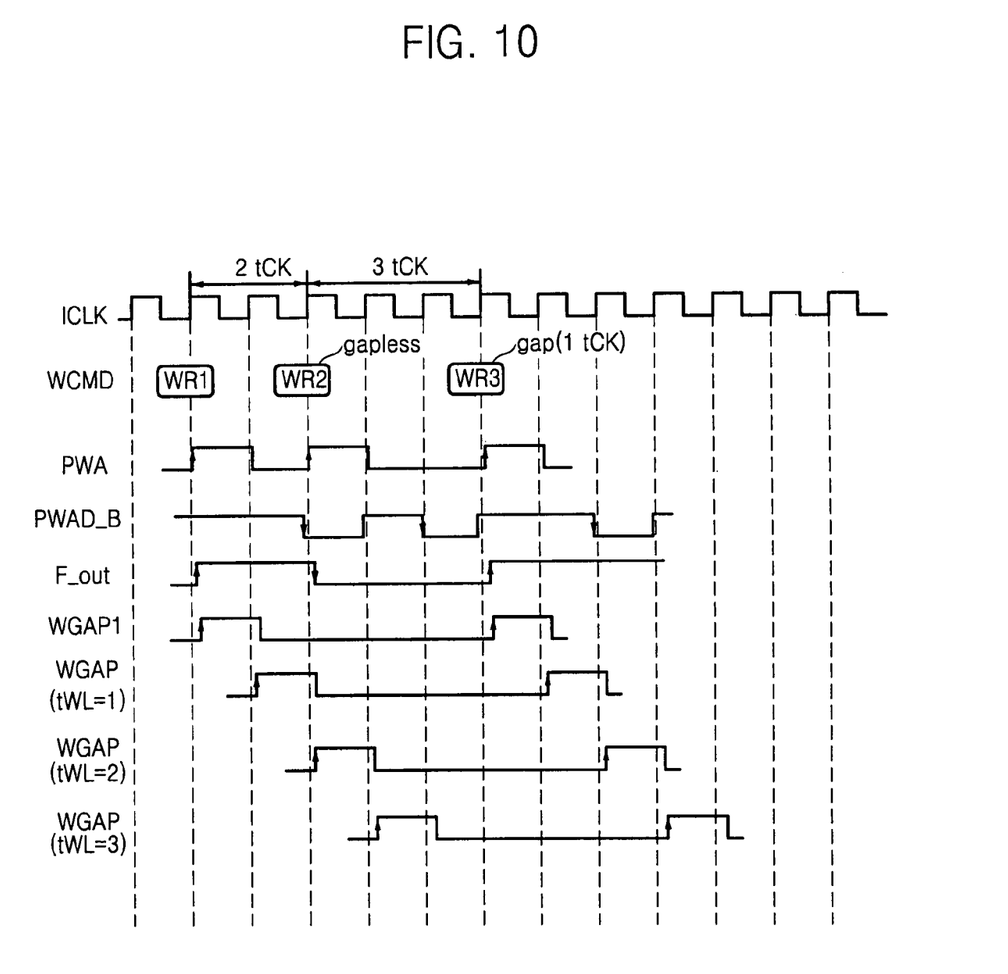
FIG. 10 is a timing diagram of signals during operation of the gap information signal detection block of FIG. 7, according to an embodiment of the present invention.

FIG. 10 is a timing diagram of signals during operation of the gap information signal detection block 710 of FIGS. 7 and 8. The data burst length is 4 and the predetermined write command delay time is 2 tCK. Referring to FIGS. 7, 8, and 10, the PWA signal is generated by sampling the write command WCMD at rising edges of the internal clock signal ICLK Thus, the PWA signal is at the logic high state from the write commands WR1, WR2, and WR3.

The PWAD_B signal is delayed from the PWA signal by the predetermined first delay time such as the predetermined write command delay time tCCD=2 tCK that is subsequently inverted. When a write command such as WR2 has no write gap, the PWA signal and PWAD_B signal have opposite logic states. For example for the second write command WR2, the PWA signal has a logic high state, and the PWAD_B signal has a logic low state. Conversely, when a write command such as WR3 has a write gap, the PWA signal and the PWAD_B signal have a same logic state. For example for the third write command WR3, the PWA signal and the PWAD_B signal have a logic high state.

The F_out signal is generated by the second flip-flop 850 by latching the PWAD_B signal clocked by the PWA signal. The WGAP1 signal is generated from an inversion of the NAND operation of the F-out signal and the PWA signal. When the WCMD signal has a write gap, the WGAP1 signal transitions from the logic low state to the logic high state such as for the third write command WR3 in FIG. 10 for example. The WGAP signal is obtained by delaying the WGAP1 signal for the predetermined write delay time such as tWL=1 for example through the second delay unit 880.

The selection block 720 receives the PCLKD signal and the WGAP signal to generate a first selection signal S_E and a second selection signal S_O there-from. More specifically, the selection block 710 transmits a pulse of the logic high state of the PCLKD signal to one of the S_E signal or the S_O signal according to the WGAP signal.

Figure 11:
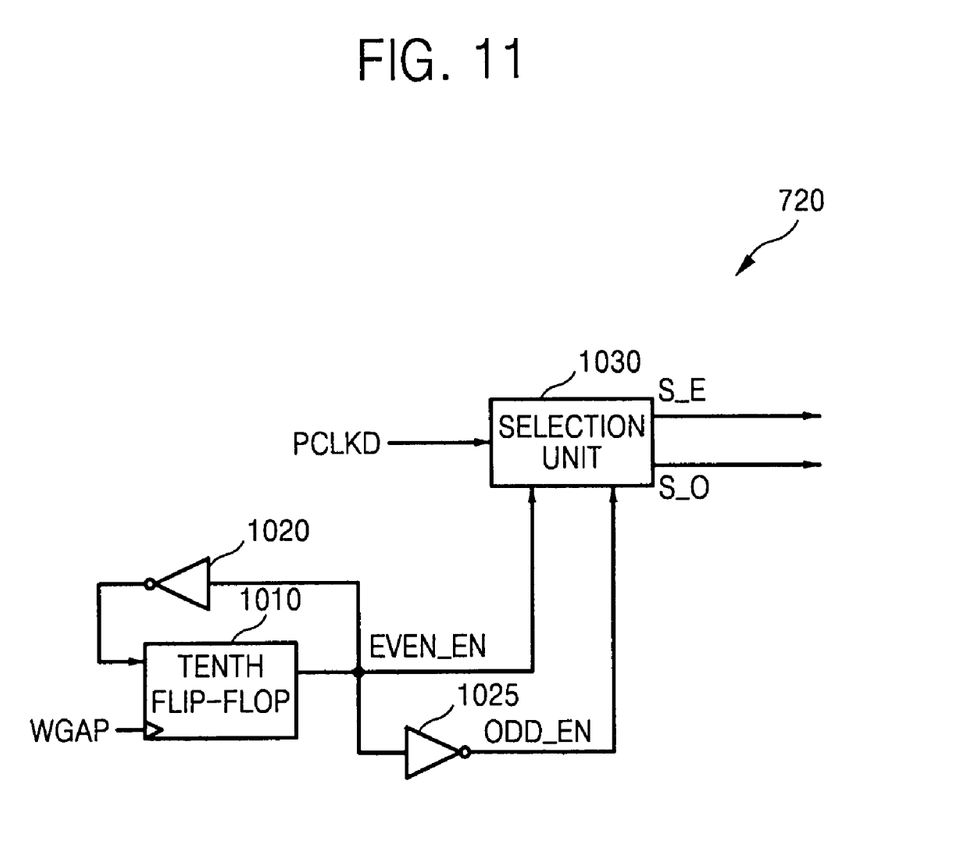
FIG. 11 is a circuit diagram of a selection block of FIG. 7, according to an embodiment of the present invention.

FIG. 11 is a circuit diagram of the selection block 720 of FIG. 7, according to an example embodiment of the present invention. Referring to FIGS. 7 and 11, the selection block 720 includes a tenth flip-flop 1010, a third inverter 1020, a fourth inverter 1025, and a selection unit 1030. The tenth flip-flop 1010 which may be a toggle flip-flop toggles a first control signal EVEN_EN being clocked to the WGAP signal. The third inverter 1020 inverts the first control signal EVEN_EN to generate an output that is input to the tenth flip-flop 1010.

Accordingly, the output of the tenth flip-flop 1010 is toggled by an edge such as rising edges of the WGAP signal. For example, whenever the WGAP signal transitions from the logic low state to the logic high state when a write gap occurs, the first control signal EVEN_EN of the tenth flip-flop 1010 is toggled.

Figure 12:
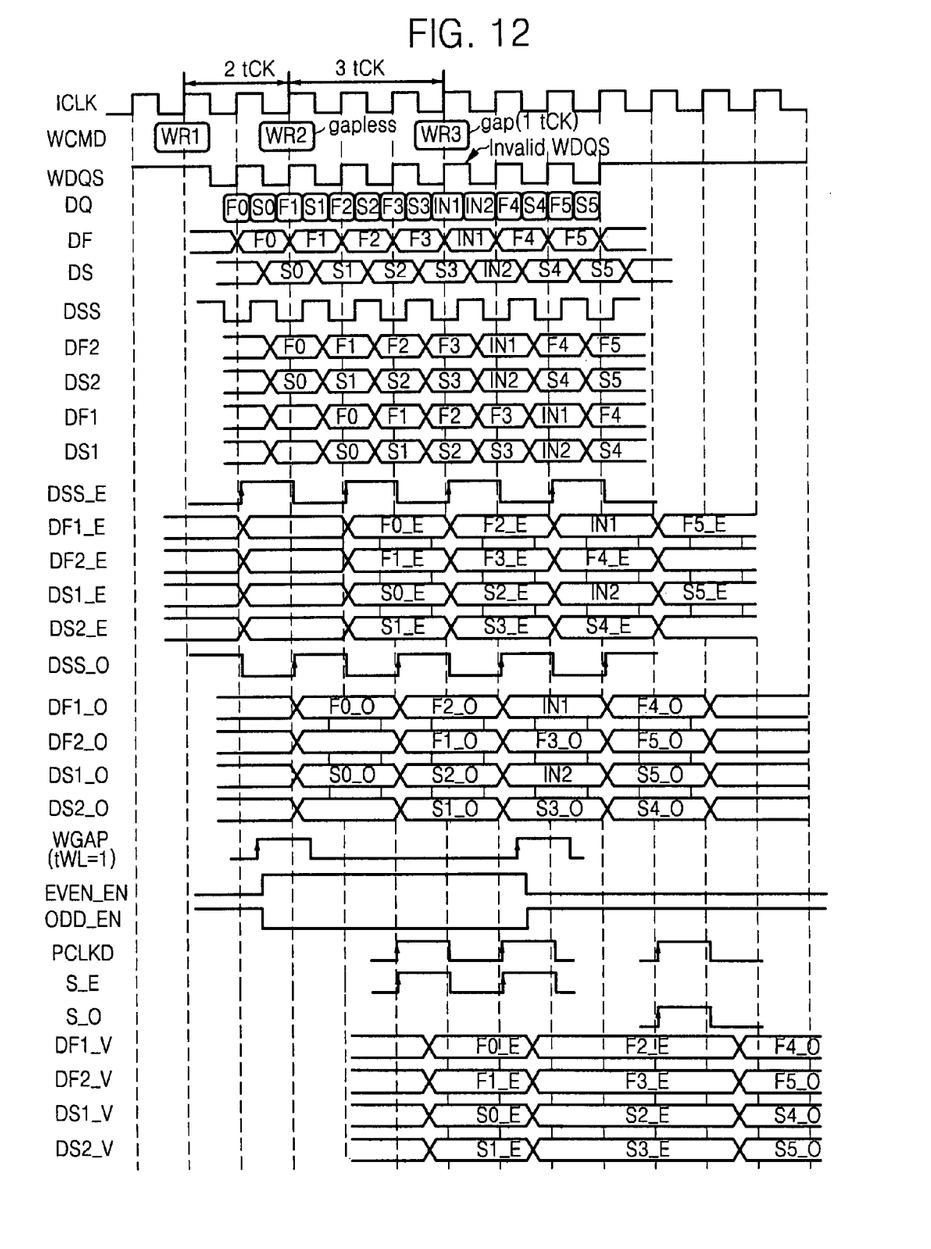
FIG. 12 is a timing diagram of signals during operation of the input data alignment circuit of FIG. 7, according to an embodiment of the present invention.

The fourth inverter 1025 inverts the first control signal EVEN_EN to generate a second control signal ODD_EN that thus has the opposite logic state from the first control signal EVEN_EN. Referring to FIGS. 11 and 12, the selection unit 1030 transmits the PCLKD signal as one of the S_E signal or the S_O signal in response to the control signals EVEN_EN and ODD_EN. For example, when the first control signal EVEN_EN is at the logic high state, the selection unit 1030 transmits the PCLKD signal as the S_E signal. The decision block 730 outputs the first group of parallel data EVEN as the valid data when the S_E signal is at the logic high state or the second group of parallel data ODD as the valid data when the S_O signal is at the logic high state.

FIG. 12 is a timing diagram of signals during operation of the apparatus 700 of FIG. 7. FIG. 12 is similar to FIG. 5 in terms of the third write command WR3 having a write gap with the Invalid WDQS being generated. The invalid data IN1 and IN2 is eliminated from the valid data DF1_V, DF2_V, DS1_V, and DS2_V generated by the decision block 730 in response to the control signals S_E and S_O.

For example in FIG. 12, the PCLKD signal is transmitted as the first control signal S_E for the first and second write command WR1 and WR2 having no write gap such that the first group of parallel data EVEN is selected by the decision block 730 as the valid data DF1_V, DF2_V, DS1_V, and DS2_V. In contrast, for the third write command WR3 having a write gap, the selection block 720 transmits the PCLKD signal as the second control signal S_O such that the second group of parallel data ODD is selected by the decision block 730 as the valid data DF1_V, DF2_V, DS1_V, and DS2_V. Also in FIG. 12 note that the first and second groups of parallel data EVEN and ODD have a data window of 2 tk such that the margin between the maximum and minimum tQSS values is increased to 2 tCK from 1 tCK of the prior art.

While the present invention has been shown and described with reference to exemplary embodiments thereof, it will be understood by those of ordinary skill in the art that various changes in form and detail may be made herein without departing from the spirit and scope of the present invention, as defined by the following claims.

The present invention is limited only as defined in the following claims and equivalents thereof.

What is claimed is:

1. An apparatus for aligning input data in a semiconductor device, the apparatus comprising:
   at least one alignment block for aligning serial input data into groups of parallel data synchronized to at least one divided data strobe signal;
   a decision block for selecting one of the groups of parallel data as valid data in response to synchronization information generated for removing any invalid data in the serial input data resulting from a write gap;
   a first alignment block for aligning the serial input data into first parallel data synchronized to a first data strobe signal, wherein each of the at least one divided data strobe signal has a frequency that is 1/N times a frequency of the first data strobe signal; and
   a second alignment block for further aligning the first parallel data synchronized to the at least one divided data strobe signal to generate the groups of the parallel data.

2. The apparatus of claim 1, wherein a first data window for the first parallel data is a cycle of the first data strobe signal, and wherein a second data window for the groups of the parallel data is a cycle of the at least one divided data strobe signal.

3. The apparatus of claim 1, further comprising:
   a data strobe buffer for generating the first data strobe signal from an external write data strobe signal; and
   a frequency divider for generating a first divided data strobe signal and a second divided data strobe signal that is 180° phase-shifted from the first divided data strobe signal.

4. The apparatus of claim 3, wherein the second alignment block includes:
   a first alignment unit for generating a first group of parallel data synchronized to the first divided data strobe signal; and
   a second alignment unit for generating a second group of parallel data synchronized to the second divided data strobe signal.

5. The apparatus of claim 4, wherein the first alignment block generates X-parallel data that are X-consecutive data of the serial input data.

6. The apparatus of claim 5, wherein each of the first and second groups of parallel data include respective X-parallel data that are X-consecutive data of the serial input data.

7. The apparatus of claim 4, further comprising:
   a sync information detection unit for generating the synchronization information from the first and second divided data strobe signal, an external clock signal used for synchronizing the serial input data, and write commands associated with the external write data strobe signal.

8. The apparatus of claim 7, further comprising:
   a clock buffer for generating an internal clock signal (ICLK) from the external clock signal;
   a write clock generation unit for generating an internal write clock signal (PCLK) from the internal clock signal and the write commands; and
   a tree block for generating a delayed internal write clock signal (PCLKD) from the internal write clock signal,
   wherein the synchronization information is generated by being clocked to the delayed internal write clock signal (PCLKD).

9. The apparatus of claim 8, further comprising:
   a sync delay unit for generating a first delayed divided data strobe signal (DDSS_E) and a second delayed divided data strobe signal (DDSS_O);
   a first flip-flop for latching the first delayed divided data strobe signal (DDSS_E) clocked with the delayed internal write clock signal (PCLKD) to generate a first synchronization information (PCLKD_E); and
   a second flip-flop for latching the second delayed divided data strobe signal (DDSS_O) clocked with the delayed internal write clock signal (PCLKD) to generate a second synchronization information (PCLKD_O),
   wherein the first and second synchronization information are used by the decision block for selecting one of the groups of parallel data as the valid data.

10. The apparatus of claim 9, wherein the first and second synchronization information are set to predetermined logic levels such that the decision block selects a predetermined one of the groups of parallel data when no invalid data is generated within the serial input data with no invalid external write data strobe signal being generated during the write gap.

11. The apparatus of claim 9, wherein a margin between minimum and maximum tDQSS values is two times a cycle of the external clock signal.

12. The apparatus of claim 4, further comprising:
   a selection block for generating selection signals used by the decision block for selecting one of the groups of parallel data, from an external clock signal used for synchronizing the serial input data and write commands associated with the external write data strobe signal.

13. The apparatus of claim 12, further comprising:
   a clock buffer for generating an internal clock signal (ICLK) from the external clock signal;
   a write clock generation unit for generating an internal write clock signal (PCLK) from the internal clock signal and the write commands;
   a tree block for generating a delayed internal write clock signal (PCLKD) from the internal write clock signal; and
   a gap information signal detection block for determining a respective write gap between each set of two consecutive write commands;

wherein the selection block transmits a pulse of the delayed internal write clock signal (PCLKD) to a first selection signal (S_E) if a write gap is not present and to a second selection signal (S_O) if a write gap is present, and wherein the decision block selects the first group of parallel data when the pulse of the delayed internal write clock signal (PCLKD) is transmitted to the first selection signal (S_E), and selects the second group of parallel data when the pulse of the delayed internal write clock signal (PCLKD) is transmitted to the second selection signal (S_O).

14. The apparatus of claim 1, wherein the valid data as generated by the decision block preserves an order of the serial input data.

15. The apparatus of claim 1, wherein the invalid data is generated in response to an invalid external write data strobe signal generated during the write gap.

16. The apparatus of claim 15, wherein the write gap occurs when a time period between two consecutive write commands is more than a predetermined write command delay time.

17. The apparatus of claim 15, wherein no invalid data is generated within the serial input data when no invalid external write data strobe signal is generated during the write gap.

18. The apparatus of claim 1, wherein the semiconductor device is a DDR (double data rate) semiconductor memory device.

19. An apparatus for aligning input data in a semiconductor device, the apparatus comprising:
at least one alignment block for aligning serial input data into groups of parallel data synchronized to at least one divided data strobe signal;
means for selecting one of the groups of parallel data as valid data in response to synchronization information;
means for generating the synchronization information such that any invalid data in the serial input data resulting from a write gap is removed;
a first alignment block for aligning the serial input data into first parallel data synchronized to a first data strobe signal, wherein each of the at least one divided data strobe signal has a frequency that is 1/N times a frequency of the first data strobe signal; and
a second alignment block for further aligning the first parallel data synchronized to the at least one divided data strobe signal to generate the groups of the parallel data.

* * * * *